(12) United States Patent
Schober et al.

(10) Patent No.: US 8,695,881 B2
(45) Date of Patent: Apr. 15, 2014

(54) CHIP CARD FOR INSERTION INTO A HOLDER

(75) Inventors: Joachim Heinz Schober, Graz (AT); Christian Zenz, Graz (AT)

(73) Assignee: NXP B.V., Eindhoven (NL)

( * ) Notice: Subject to any disclaimer, the term of this patent is extended or adjusted under 35 U.S.C. 154(b) by 928 days.

(21) Appl. No.: 11/631,211

(22) PCT Filed: Jun. 22, 2005

(86) PCT No.: PCT/IB2005/052040
§ 371 (c)(1),
(2), (4) Date: Mar. 3, 2009

(87) PCT Pub. No.: WO2006/003548
PCT Pub. Date: Jan. 12, 2006

(65) Prior Publication Data
US 2009/0200381 A1 Aug. 13, 2009

(30) Foreign Application Priority Data
Jun. 30, 2004 (EP) .................................. 04103068

(51) Int. Cl.
*G06K 7/00* (2006.01)
(52) U.S. Cl.
USPC ........................................................ 235/486
(58) Field of Classification Search
USPC ........................................................ 235/486
See application file for complete search history.

(56) References Cited

U.S. PATENT DOCUMENTS

| | | | |
|---|---|---|---|
| 5,291,061 A * | 3/1994 | Ball | 257/686 |
| 5,320,552 A | 6/1994 | Reichardt et al. | |
| 5,526,235 A * | 6/1996 | Beason et al. | 361/799 |
| 5,939,778 A | 8/1999 | Boutin et al. | |
| 6,174,188 B1 | 1/2001 | Martucci | |
| 6,193,557 B1 | 2/2001 | Luvini et al. | |
| 6,288,904 B1 * | 9/2001 | Houdeau et al. | 361/760 |
| 6,288,905 B1 | 9/2001 | Chung | |
| 6,325,637 B1 * | 12/2001 | Barnett | 439/67 |
| 6,601,770 B1 * | 8/2003 | Ikefuji et al. | 235/492 |
| 6,719,205 B1 * | 4/2004 | Puschner et al. | 235/492 |
| 7,213,766 B2 * | 5/2007 | Ryan et al. | 235/492 |
| 2004/0142540 A1 * | 7/2004 | Kellar et al. | 438/455 |
| 2005/0052851 A1 * | 3/2005 | Yamada et al. | 361/737 |

FOREIGN PATENT DOCUMENTS

| | | |
|---|---|---|
| CN | 1402249 A | 3/2003 |
| EP | 0869452 A | 10/1998 |
| FR | 2783947 A1 | 3/2000 |
| WO | 9630944 A3 | 10/1996 |
| WO | 0108092 A1 | 2/2001 |
| WO | 02073153 A2 | 9/2002 |
| WO | 02073819 A2 | 9/2002 |

OTHER PUBLICATIONS

International Search Report, PCT/IB2005/052040, Jun. 22, 2005.

* cited by examiner

*Primary Examiner* — Michael G Lee
*Assistant Examiner* — David Tardif

(57) ABSTRACT

The invention relates to a chip card (CC), in particular a SIM card, inserted for operation into a holder (HH), which holder (HH) is equipped with electrical device contacts (GK) and a press-on device (AE). The chip card (CC) comprises a substrate (S), a contact field (K), a chip (C), and a single-piece encapsulation (V). According to the invention, the encapsulation (V) has a thickness (dV) which ensures that, on insertion of the chip card (CC), the encapsulation (V) has body contact with the press-on device (AE), the contact field (K) has body contact with the device contacts (GK), and the contact field (K) is reliably electrically contacted to the device contacts (GK). No further carrier material (T) is provided.

13 Claims, 3 Drawing Sheets

CHIP CARD FOR INSERTION INTO A HOLDER

FIELD OF THE INVENTION

The invention relates to a chip card for insertion into a holder, which holder is equipped with electrical device contacts and a press-on device, comprising an electrically insulating planar substrate with a first surface and an opposing second surface, a metallic planar contact field applied to the first surface, a chip located on the second surface and electrically connected to the contact field, and a single-piece encapsulation located on the second surface and enclosing the chip.

The invention further relates to an arrangement of several chip cards as described above.

BACKGROUND OF THE INVENTION

There are many applications for chip cards in the modem world, for instance as phone cards, ATM cards, access cards for Pay-TV and so-called "subscriber identity modules" or SIM cards for short. In order to produce the cards as cost-effectively as possible, a uniform size of 85×54 mm, i.e. the format of a credit card, was agreed. This ensures the easy handling of said cards. At the beginning of the GSM era, in the early nineties, even SIM cards were used in this format. As a result of increasing miniaturization, however, today's SIM cards are only a fraction of the original size.

SIM cards are nevertheless produced using the same process as in the early nineties. In this process, a comparably small chip card module of the approximate size of the contact field, which is standardized in accordance with ISO 7810, is installed into a carrier 85×54 mm in size. One possible method is based on bonding the chip card module into a milled recess in the chip card. Another possible method is based on placing the chip card module into the mold when molding a card and installing it into the carrier in this way.

Today's small SIM card is then punched out of the carrier, or a perforation is produced to enable the SIM card to be removed from the carrier. Prior to this process, the SIM module may be personalized, i.e. given a unique electronic code which will later permit the positive identification of a subscriber to a telephone network. The SIM card is only ready for insertion into a holder in a mobile phone after being punched or broken out of the carrier.

Devices for use with a chip card, such as mobile phones, are provided with holders with device contacts and a, press-on device for this purpose. If the chip card is inserted into the holder, the press-on device ensures a reliable contact between the planar contact field of the chip card and the device contacts.

Owing to the design of commonly used press-on devices, the thickness of the chip card plays an important role, because only a defined thickness allows the insertion of the chip card into the holder on the one hand while ensuring the required contact force on the other hand. The press-on device, which applies pressure to the top of the chip card, is elastically deformed. when the latter is inserted and introduces a greater or lesser degree of force into the chip card, depending on its thickness. A thicker chip card results in a higher pressure and therefore contact force, a thinner chip card in a lower pressure and therefore contact force. Additional spring-loaded contacts are often used, which, owing to a relatively low spring constant, are better able to compensate for component tolerances.

An example for a press-on device are guide rails under which the card is inserted. These guide rails allow the chip card to move in the direction of insertion while preventing any movement in the transverse direction. When the chip card is inserted into the holder provided with spring-loaded contacts, the chip card pushes these contacts away, pressing the contact field against the device contacts as a result of its spring-constant.

Further examples for press-on devices are flaps pressed against the top of the chip card or latching devices preventing the opposite movement of the chip card during insertion from a defined position in the direction of insertion, which may extend at right angles to the surface represented by the contact field.

For the reasons explained above, holders in common use are designed for the thickness of a credit card of approximately 0.8 mm. Conversely, this means that a chip card has to have this thickness if it is to function satisfactorily. This is achieved, as mentioned above, by installing the chip card module into a card carrier, which can be produced to very fine tolerances. The chip card module has to be correspondingly thinner, having a thickness of approximately 0.6 mm.

Quite apart from polluting the environment with unnecessary waste, the conventional production method is technically complex and therefore expensive because of the many process steps involved. In addition, the volume available for the chip is extremely limited as a result of this technology. The production of the chip either requires an expensive method allowing for small structures, or functionality has to be sacrificed. In either case, conditions for producing chip cards are less than satisfactory.

OBJECT AND SUMMARY OF THE INVENTION

It is therefore an object of the invention to specify a chip card which overcomes the above problems.

This object is achieved by specifying a chip card as presented in the opening paragraph, wherein the encapsulation of the chip card has such a thickness that, on insertion of the chip card, the encapsulation has body contact with the press-on device, the contact field has body contact with the device contacts, and the contact field is reliably electrically contacted to the device contacts.

The thickness of the encapsulation enclosing the chip is therefore so chosen that the chip card acts together with the holder for satisfactory contacting. The thickness of the substrate and the thickness of the contact field will, of course, have to be taken into account. No further carrier material is involved, significantly simplifying the production process of a chip card. The bonding of a chip card module into a carrier and the subsequent punching-out of the chip card are no longer required. The environment is therefore no longer polluted by punching residues. In view of the great number of hip cards produced every year, in particular, this represents a substantial progress.

It should here be mentioned that the invention is not restricted to chip cards used as SIM cards, but includes cards for any application. In particular, it is feasible that miniaturization will in future affect credit cards, ATM cards, customer cards, access cards for digital television or radio and the like. It is, for instance, conceivable that comparatively small credit cards could be inserted into mobile terminal equipment such as a mobile phone or a PDA and payment transactions could in the future be completed using wireless systems via the above terminal equipment.

It is advantageous if the encapsulation in the region of the contact field has such a base surface that the contact field is reliably contacted to the device contacts on insertion of the chip card. As the substrate and the contact field are relatively thin, their mechanical strength is rather poor. For this reason, the chip card has to be provided with the strength required in view of the contact force and the loads generated in daily use in some other way. For this reason, the encapsulation, the primary object of which is the protection of the chip, is extended to essential regions of the contact field, allowing the press-on device of the holder to contact the contact field reliably.

It is particularly advantageous if the base surface of the encapsulation is at least as large as the contact field without projecting beyond the edge of the substrate. This ensures that the whole contact field is reliably contacted to the device contacts of the holder. The encapsulation may, of course, extend beyond the contact field without affecting the contacting. It is, however, preferable if the encapsulation does not extend beyond the substrate, because this simplifies the production of the chip card according to the invention. Following the application of the encapsulation, the chip cards are punched out of the substrate, or the substrate is perforated along a housing edge. Both processes are easier if the substrate projects slightly beyond the encapsulation. An overhang of approximately 0.2 mm is proposed as a practical dimension.

In a particularly advantageous design of the chip card according to the invention, an edge towards the substrate is provided around the contact field. This measure, too, offers advantages when punching or perforating the substrate. The reason is that the metal layer of which the contact field is made and which as a rule consists of copper with a gold coating is not so easily separated as the substrate, which is usually made of glass fibers impregnated with epoxy resin. While the substrate breaks bluntly, the metal layer tends to fray when being separated. If a chip card with a perforated substrate, for instance, is separated manually, the metal layer can be at least partially separated from the substrate in the extreme case. The edge of the contact field towards the substrate further simplifies the insertion of a chip card into a holder. In units with spring-loaded contacts, in particular, the relatively robust substrate first comes into mechanical contact with the device contacts, pushing them aside. Only then does the contact field contact the device contacts, inhibiting the separation of the contact field from the substrate during frequent use.

It is further particularly advantageous if the substrate has holes leading from the first to the second surface and if the encapsulation extends into these holes. The above holes can fulfil a dual function. On the one hand, they permit the so-called "bonding", i.e. the joining of the chip located on the second surface of the substrate to the contact field located on the first surface of the substrate by means of a wire generally made of gold. On the other hand, the encapsulation, which is applied by a process such as injection molding, can also penetrate into the holes and is therefore better joined to the substrate. In particular when a chip card in inserted into a holder, shear stresses are generated within the chip card, which may in the worst case result in the separation of the encapsulation from the substrate and thus in the destruction of the chip card. The positive connection between substrate and encapsulation effected by sections of the encapsulation projecting into the holes inhibits this tendency. The effect in question occurs in particular in substrates metallized on both faces, because the usually plastic encapsulation does only adhere very poorly to the gold-coated metal layer.

The external dimensions expediently correspond to those of a SIM card for a mobile phone. If the encapsulation is dimensioned to provide a chip card of SIM card size in conjunction with the substrate and the contact field, the chip card according to the invention can immediately be used in equipment such as mobile phones without having to modify the equipment in question. For commonly used chip cards, in which the contact field is approximately 35 µm thick while the substrate is 110 µm thick, a thickness of approximately 655 µm would be chosen for the encapsulation, taking account of component tolerances. This means that the thickness of the encapsulation can, of course, differ from the above dimension.

It is further particularly advantageous if at least one further chip is arranged above a chip located on the second surface, the encapsulation enclosing all chips. By omitting the carrier material, a gain of approximately 200 µm in component height can be achieved, which is available for additional chips with a thickness of approximately 150 µm. A memory chip may, for instance, be placed piggyback-fashion on the processor chip of the chip card to extend its functional range. The integration of an additional processor chip covering the functions corresponding to the standard for "near field communication", NFC in short, is also conceivable. Even the combination of digital and analog standard chips is made comparatively easy.

In the same way, it is advantageous if at least one further chip is added next to the chip located on the second surface, the encapsulation enclosing all chips. In this case, an additional chip is placed not above the existing chip but next to it. By omitting the flange required for bonding, volume for additional chips becomes available. The restrictions imposed by current technology on the available volume are expediently eliminated by the chip card according to the invention. It is, however, alternatively conceivable to use the acquired space for a cheaper, i.e. coarse, chip technology. Equivalent functionality can therefore be integrated into a larger and thus technically less complex chip.

In this context, it is expedient if at least one of the chips is designed as a processor and at least one other chip as a memory. A memory chip is, for instance, placed piggyback-fashion on top of the existing processor chip. This means that standard memory chips, which can be mass-produced more cheaply than a memory area on a processor chip, can be used. A further advantage of this variant of the invention lies in the fact that a processor chip of coarsely structured chip technology can be integrated with a memory chip of finely structured chip technology within one and the same chip card. This facility has not been available so far—owing to prior art production methods.

An advantageous variant of the invention features a chip card with at least one insertion direction and an encapsulation which facilitates insertion in the appropriate direction. The fact that the encapsulation is generally produced by injection molding opens up new possibilities with regard to the shaping of the chip card. The encapsulation may, for instance, be chamfered or radiused at the leading end in the direction of insertion to make the insertion of the chip card into the holder easier. This chamfer or radius can either be produced during the injection molding process or by milling or grinding. In view of to the punching process of the known production method, it has previously not been possible to produce a chip card of this shape.

A further advantageous variant of the invention features a chip card with at least one direction of insertion and an encapsulation which prevents insertion against the direction of insertion. As a result of injection molding technology, a chip card can be provided with a one-sided groove running in the direction of insertion, which permits the insertion of the chip card into the holder in one direction only. During the insertion process, a specially designed guide rail of the holder engages this groove. The chip card cannot be inserted the wrong way round, because this is prevented by the missing groove and the guide rail. Other conceivable designs involve recesses and lugs located on the leading edge of the chip card relative to the direction of insertion. Here, too, corresponding means have to be provided on the holder to prevent insertion in the opposite direction.

The object of the invention is further achieved by an arrangement of several chip cards, wherein these are located on a common substrate and wherein the encapsulations of the individual chip cards are so spaced that the chip cards are easy separable.

For further processing of the chip cards, it may be useful to manipulate a plurality of chip cards simultaneously. Strips or rolls of SIM cards may, for instance, be supplied to a mobile radio telephone operator, enabling him to personalize the chip cards in an economical way. Following this process, the SIM cards are separated, for instance by cutting or clipping, and forwarded to the end user.

In this context, it is advantageous if the substrate is perforated between the encapsulations of individual chip cards. Based on the above example, the cards can be separated without any tools. Owing to the perforation, individual SIM cards can simply be broken off the strip or roll. For the sake of completeness, it should be mentioned that this design of the invention is, of course, not restricted to SIM cards but can be applied to chip cards in general.

These and other aspects of the invention are apparent from and will be elucidated with reference to the embodiments described hereinafter without being restricted to said embodiments.

DESCRIPTION OF EMBODIMENTS

Figure 1A:
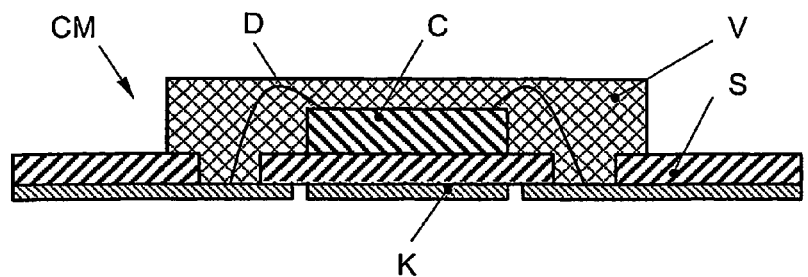
FIG. 1a is a cross-section through a chip card module according to prior art.

FIG. 1a shows a chip card module CM according to prior art. A contact field K is applied to a first side of the substrate S, while a chip C is bonded to the second side of the substrate S opposite the first side. The chip C is connected to the contact field K by wires D, said wires D running through holes in the substrate S which lead from the first to the second side of the substrate S. The chip C and the wires D are embedded in an encapsulation V protecting the chip C and the wires D from external influences while being significantly smaller than the substrate S in the present case.

Figure 1B:
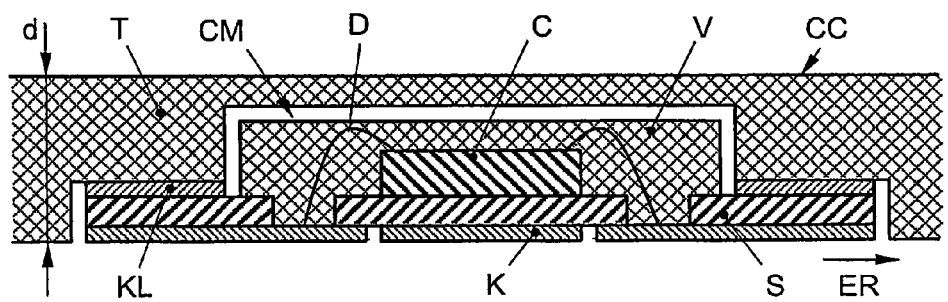
FIG. 1b shows the chip card module from FIG. 1a bonded into a carrier material.

FIG. 1b shows a chip card CC, the chip card module from FIG. 1a having been bonded into a carrier material T. The carrier material T features a recess slightly larger than the chip card module CM, which has been produced by a method such as milling. The chip card module is installed into the carrier material T with the aid of an adhesive layer KL to form the chip card CC therewith. The carrier material T has, for instance, the size of a credit card or a SIM card. Owing to the design of the holder, the chip card CC moreover has to have a defined thickness d for reliable contact between the contact field K and the device contacts of the holder after the insertion of the chip card CC. The direction of insertion ER of the chip card CC as a rule runs parallel to the first surface of the substrate S. Depending on the design of the holder, however, different directions of insertion ER are possible.

Figure 2:
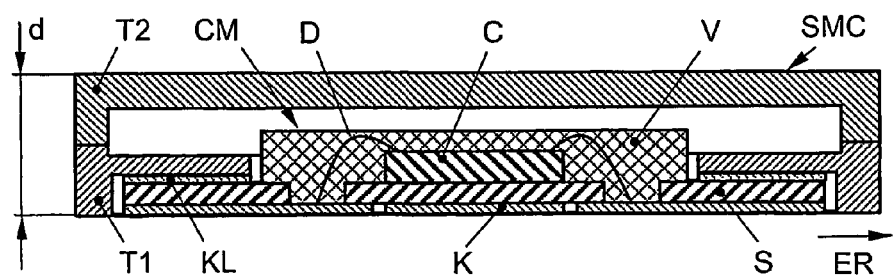
FIG. 2 shows a so-called "smart media card" according to prior art.

FIG. 2 shows a so-called "smart media card" SMC according to prior art. Such cards are, for instance, used as memory cards for digital cameras. In contrast to the chip card CC according to FIG. 1b, the carrier material is made in two parts. The chip card module CM is installed into a first carrier part T1 with the aid of an adhesive layer KL, followed by bonding the second carrier part T2 thereto. As an alternative, it would be feasible to weld the two carrier parts T1 and T2 together to produce the smart media card SMC. The most commonly used direction of insertion ER of the smart media card SMC one again extends parallel to the first surface of the substrate S. Owing to the design of the holder, the smart media card SMC likewise has to have a defined thickness d for reliable contact between the contact field K and the device contacts of the holder after the insertion of the smart media card SMC.

Figure 3:
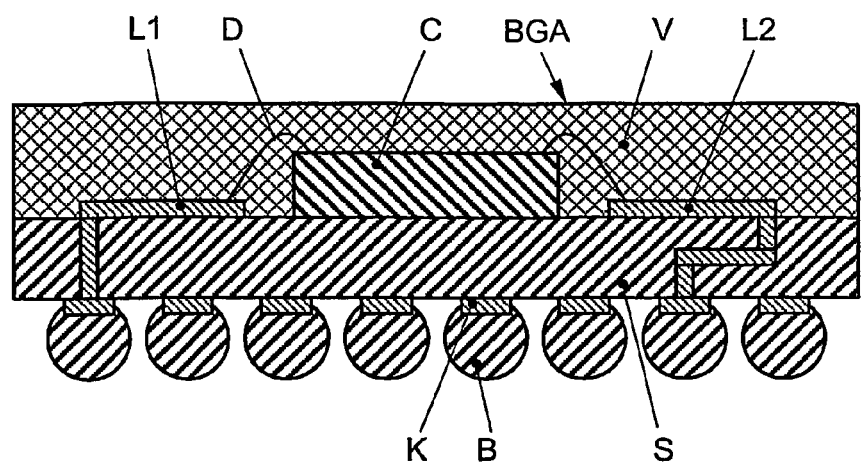
FIG. 3 shows a so-called "ball grid array" according to prior art.

FIG. 3 shows a so-called "ball grid array" BGA according to prior art, which once again comprises a substrate S with a contact field K applied to a first surface. In this case, however, the substrate S is slightly thicker than that of the chip card modules CM shown above. The reason for this is that ball grid arrays BGA as a rule require several conductor layers to connect the plurality of contacts to the chip C. On a second surface of the substrate S opposite the first surface, conductors L1 and L2 and a chip C are located. Here, too, the chip C is connected to the conductors L1 and L2 by wires D, which are in turn connected to the contact field K. In contrast to the chip card module CM according to FIG. 1a, the wires D do not pass through holes in the substrate S, but terminate on the second surface of the substrate S. The chip C and the wires D are enclosed by an encapsulation V which, in a ball grid array BGA, is generally as large as the substrate S. Tin balls B located on the contact field K connect the ball grid array BGA to a device board. For assembly, the ball grid array BGA is placed on the board and then heated from above until the tin balls B melt and are joined to the contacts on the device board. The thickness d of the ball grid array BGA is therefore irrelevant in regard to reliable contacting.

For the sake of completeness, so-called "pin grid arrays" should here be mentioned; their structure is analogous to that of the ball grid arrays BGA, but the planar contact field K with the tin balls B is replaced by contact pins. A known example for pin grid arrays is a commercial processor for a PC. The direction of insertion ER of a pin grid array runs at right angles to the first surface of the substrate S. The thickness d of the pin grid array is therefore likewise irrelevant in regard to reliable contacting.

Figure 4:
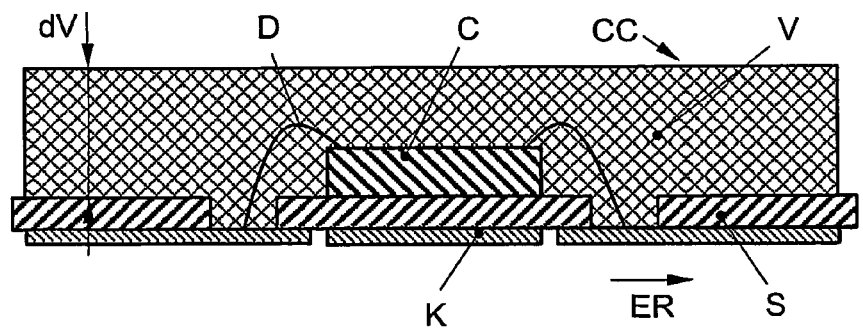
FIG. 4 shows a chip card CC according to the invention.

FIG. 4 finally shows a chip card CC according to the invention. In analogy to the chip card module CM, its structure is similar to that shown in FIG. 1a, but the size of the encapsulation V is essentially the same as that of the substrate S, the thickness dV of the encapsulation V matching that of the holder to ensure a reliable contact between the contact field K and the device contacts of the holder after the insertion of the chip card CC. The direction of insertion ER of the chip card CC is once again parallel to the first surface of the substrate S. Depending on the type of holder, however, other directions of insertion ER, such as at right angles to the first surface of the substrate S, are also possible. The chip card CC could conceivably be inserted into a holder with a retaining flap.

Differences from the chip card CC according to FIG. 1a and the smart media card SMC according to FIG. 2 are easily identified. While the latter require additional carrier material T or carrier parts T1 and T2 to define the external dimensions of the chip card CC or the smart media card SMC respectively, in the present case the substrate S and the encapsulation V are dimensioned as required.

Figure 5A:
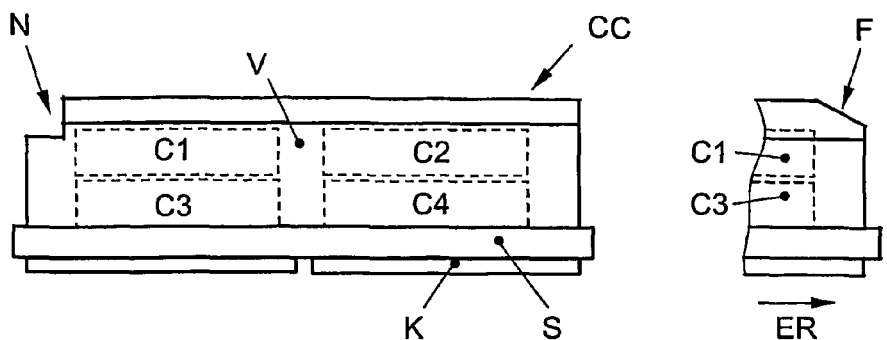
FIG. 5a shows a chip card according to the invention with a plurality of chips.

FIG. 5a shows a chip card CC with several chips C1, C2, C3, C4 in a front and a side view. A contact field K is applied to a first side of the substrate S, while a third and a fourth chip C3 and C4 are bonded to the second side of the substrate S opposite to the first side. A first chip C1 is mounted above the third chip C3 and a second chip C2 is mounted above the fourth chip C4. The third chip C3 may be a SIM module according to prior art, the fourth chip C4 an NFC module, and the first and second chips C1 and C2 may be standard memory chips. For simplicity, the individual electrical connections are not illustrated. All of the chips C1, C2, C3, C4 are embedded in an encapsulation V, which in the present case has a chamfer F simplifying the insertion of the chip card CC into the holder in the direction of insertion ER. In addition, the encapsulation V has a groove F preventing the insertion of the chip card CC into the holder against the direction of insertion ER.

Figure 5B:
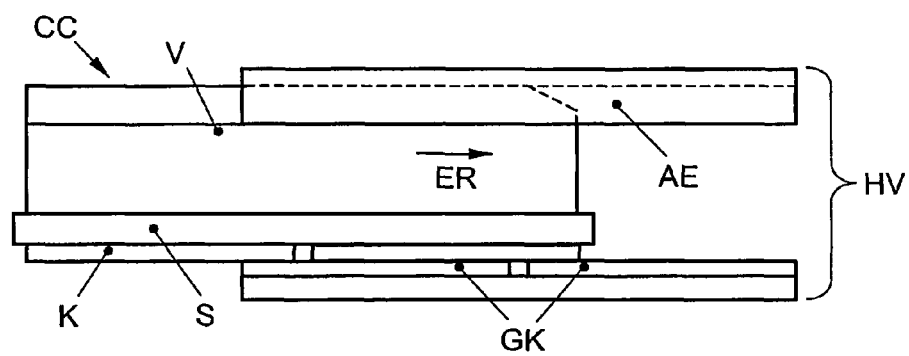
FIG. 5b shows the chip card from FIG. 5a partially inserted into a holder.

FIG. 5b shows a chip card CC according to FIG. 5a partially inserted into a diagrammatically represented holder HV in the direction of insertion ER. It can easily be seen that the encapsulation V is in body contact with the press-on device AE and the contact field K is in body contact with the device contacts GK. The device contacts GK of commonly used holders HV are arranged at a constant distance from the press-on device AE. The press-on device AE is usually made of plastic and therefore deformed relatively easily. By suitable selection of the thickness dV, the contact force between the contact field K and the device contacts GK can be adjusted for reliable electrical contacting.

Figure 6:
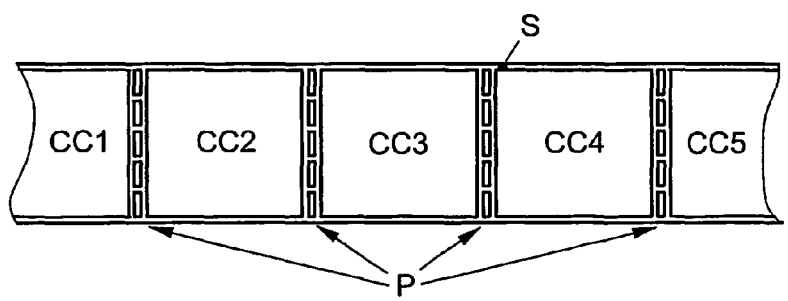
FIG. 6 shows an arrangement of several chip cards on a common substrate.

FIG. 6 finally shows an arrangement of several chip cards CC1 . . . CC5 on a common substrate S, with a perforation P being provided between individual chip cards CC1 . . . CC5 to simplify the separation of the chip cards CC1 . . . CC5. The production of several chip cards CC1 . . . CC5 on a common substrate S is particularly economical. Owing to the elasticity of the substrate S, several chip cards CC1 . . . CC5 can even be rolled up.

In conclusion, it should be noted that the features of the various embodiments of the invention may either be present individually or combined as preferred.

The invention claimed is:

1. A chip card for insertion into an electronic device that is provided with a holder, which holder is equipped with electrical device contacts and a press-on device, the chip card comprising:
an electrically insulating planar substrate with a first major surface, an opposing second major surface, and a perimeter edge surface;
a metallic planar contact field applied to the first major surface of the electrically insulating planar substrate;
a chip located on the second major surface of the electrically insulating planar substrate and electrically connected to the metallic planar contact field; and
a single-piece injection molded encapsulation located on the second major surface of the electrically insulating planar substrate and enclosing the chip, wherein the single-piece injection molded encapsulation is a monolithic structure that is located directly on the chip and on the second major surface of the of the electrically insulating planar substrate to form a solid structure that is free of a cavity;
wherein the single-piece injection molded encapsulation, with no further encapsulation material required, has such a thickness that, on insertion of the chip card into the holder, the single-piece injection molded encapsulation has body contact with the press-on device of the holder, the contact field has body contact with the device contacts of the holder, and the contact field is reliably electrically contacted to the device contacts of the holder;
wherein a top base surface of the single-piece injection molded encapsulation is at least as large as the contact field without projecting beyond the perimeter edge of the substrate; and
wherein the perimeter edge of the substrate projects beyond a perimeter edge of the single-piece injection molded encapsulation and beyond a perimeter edge of the contact field.

2. A chip card as claimed in claim 1, characterized in that the single-piece injection molded encapsulation in the region of the contact field has such a base surface that the contact field is reliably contacted to the device contacts on insertion of the chip card.

3. A chip card as claimed in claim 1, characterized in that the substrate has holes leading from the first to the second surface and the single-piece injection molded encapsulation extends into these holes.

4. A chip card as claimed in claim 1, characterized in that its external dimensions correspond to those of a SIM card for a mobile phone.

5. A chip card as claimed in claim 1, characterized in that at least one further chip is arranged next to the chip located on the second surface, the single-piece injection molded encapsulation enclosing all chips.

6. A chip card as claimed in claim 1, wherein the chip card includes at least two further chips and characterized in that at least one of the two further chips is designed as a processor and at least one of the two further chips is designed as a memory.

7. A chip card as claimed in claim 1, characterized in that it has at least one direction of insertion and the single-piece injection molded encapsulation has a shape which simplifies insertion in said direction.

8. A chip card as claimed in claim 1, characterized in that it has at least one direction of insertion and the single-piece injection molded encapsulation has a shape which prevents insertion against said direction of insertion.

9. An arrangement of several chip cards as claimed in claim 1, characterized in that they are located on a common substrate and the single-piece injection molded encapsulations of the individual chip cards are so spaced that the chip cards are easy separable.

10. An arrangement as claimed in claim 9, characterized in that the substrate is provided with perforations between the single-piece injection molded encapsulations of the individual chip cards.

11. A chip card as claimed in claim 1, characterized in that at least one further chip is arranged within the chip card, the one further chip comprising a near field communication (NFC) chip.

12. An chip card as claimed in claim 1, characterized in that at least one further chip is arranged above the chip located on the second surface, the single-piece injection molded encapsulation enclosing all chips.

13. An chip card as claimed in claim 1, characterized in the substrate projects beyond the perimeter edge of the single-piece injection molded encapsulation by approximately 0.2 mm.

* * * * *